United States Patent [19]

Lombard et al.

[11] Patent Number: 5,281,389
[45] Date of Patent: Jan. 25, 1994

[54] PALLADIUM PASTE AND PROCESS FOR FORMING PALLADIUM FILM ONTO A CERAMIC SUBSTRATE UTILIZING THE PASTE

[75] Inventors: James H. Lombard; Rong-Fong Huang, both of Albuquerque; Carlos A. Sanchez, Los Lunas, all of N. Mex.; Ming-Yih Su, Taipei, Taiwan

[73] Assignee: Motorola, Inc., Schuamburg, Ill.

[21] Appl. No.: 923,631

[22] Filed: Aug. 3, 1992

[51] Int. Cl.$^5$ .............................................. B22F 7/02
[52] U.S. Cl. ...................................... 419/8; 419/19; 252/514; 252/520; 252/521; 427/226; 427/123; 427/126.2; 427/126.3; 428/551; 29/825
[58] Field of Search ................ 252/514, 520, 521; 419/8, 19; 427/59, 123, 126.2, 126.3, 226; 75/235; 428/551

[56] References Cited

U.S. PATENT DOCUMENTS

| | | | |
|---|---|---|---|
| 4,416,932 | 11/1983 | Nair | 428/209 |
| 4,954,926 | 9/1990 | Pepin | 361/304 |
| 5,019,306 | 5/1991 | Huang | 264/66 |

FOREIGN PATENT DOCUMENTS

| | | |
|---|---|---|
| 49-008528 | 1/1974 | Japan. |
| 61-188473 | 8/1986 | Japan. |
| 429473 | 5/1974 | U.S.S.R.. |

Primary Examiner—Donald P. Walsh
Assistant Examiner—Ngoclan T. Mai
Attorney, Agent, or Firm—Douglas D. Fekete

[57] ABSTRACT

A palladium paste is utilized for forming a palladium film on a ceramic substrate. The paste includes a sinterable palladium powder dispersed in a vaporizable liquid vehicle. The paste also includes minor additions of titanium dioxide powder and a metal titanate powder. A preferred titanate powder is composed of strontium calcium titanate. It is found that the additions remarkably improve adhesion of the palladium film to the substrate.

21 Claims, No Drawings

PALLADIUM PASTE AND PROCESS FOR FORMING PALLADIUM FILM ONTO A CERAMIC SUBSTRATE UTILIZING THE PASTE

BACKGROUND OF THE INVENTION

This invention relates to a paste of the type used to apply a layer of sinterable palladium particles that are subsequently sintered to form a palladium film on a ceramic substrate. More particularly, this invention relates to a palladium paste that includes additions of a titanium dioxide powder and a metal titanate powder to enhance adhesion of the film to the substrate. In one aspect, this invention relates to a co-firing process in which the paste is applied to a ceramic powder base, and the coated base is heated to sinter the ceramic powder to complete the substrate and to concurrently sinter the palladium powder to form a film bonded to the substrate.

In the manufacture of an electronic component or the like, it is known to utilize a co-firing process to form a metal film onto a ceramic substrate. The substrate is derived from a base of ceramic powder and an expendable organic binder. The metal film is formed from metal powder that is suspended in a liquid vehicle to form a paste that permits the powder to be applied by convenient techniques, such as spraying or screen printing. The paste is applied to the base and dried to form a particulate layer. An expendable organic binder may be included in the paste to improve bonding of the particles within the layer. The base and the applied layer are heated to a temperature and for a time sufficient to sinter the ceramic powder to form the substrate and concurrently to sinter the metal powder to form a film bonded to the substrate.

Substrates formed of a metal titanate compound, such as strontium calcium titanate (SCT), may require relatively high sintering temperatures greater than about 1,250° C. Many metals have melting points less than this higher sintering temperature and are not suitable for forming co-fired films on titanate substrates. Palladium is sinterable at the higher temperature, but tends to form a film having poor adhesion to the underlying ceramic. Therefore, there is a need to improve adhesion of a palladium film formed from a paste applied to a ceramic substrate and, in particular, to a substrate that is concurrently formed in a co-firing process carried out at a relatively higher temperature.

SUMMARY OF THE INVENTION

This invention contemplates an improved process utilizing a palladium paste for forming a palladium film onto a ceramic substrate. The paste includes sinterable palladium powder dispersed in a vaporizable liquid vehicle. In accordance with this invention, the paste also includes minor additions of titanium dioxide powder and a powder composed of a metal titanate compound, which additive powders cooperate to enhance adhesion of the palladium film to the substrate. In a preferred aspect of this invention, the paste is employed to form a palladium film onto a titanate substrate that is concurrently sintered in a co-firing process.

DESCRIPTION OF A PREFERRED EMBODIMENT

In a preferred embodiment, an improved palladium paste in accordance with this invention is utilized in a co-firing process to form a palladium film bonded to a substrate formed of manganese-modified strontium calcium titanate ceramic, referred to as SCT. A preferred manganese-modified strontium calcium titanate is described in U.S. Pat. No. 5,019,306, issued to Huang et al. in 1991, and incorporated herein by reference. In general, the preferred material is characterized by the formula $(Sr_x Ca_y Mn_z)TiO_3$ in which $0.98 < x+y+z < 1.02$, $0.34 < y < 0.4$ and $0.0075 < z < 0.015$.

In a specific example, SCT powder was prepared from a mixture composed of, by weight, about 48.6 parts powdered strontium carbonate, $SrCO_3$, about 13.4 parts powdered calcium carbonate, $CaCO_3$, about 37.6 parts powdered titanium dioxide, $TiO_2$, and about 0.4 parts powdered manganese titanate, $MnT_iO_3$. The mixture was blended using a water-base lubricant, dried at about 95° C., and calcined at a temperature between about 1,125° C. and 1,175° C. for a period of about 4 hours. The calcined product was pulverized to produce a powder. The resulting SCT powder had a formula in accordance with $(Sr_x Ca_y Mn_z)TiO_3$ wherein x is about 0.63, y is about 0.36 and z is about 0.01.

In accordance with this invention, a paste was prepared by dispersing metallic palladium powder, titanium dioxide powder, and the SCT powder in a liquid vehicle. The powder portion for the paste was composed of about 5 weight percent SCT powder, about 1.5 weight percent titanium dioxide powder and the balance palladium powder. As used herein, proportions for powdered constituents are based upon the combined weight of the powders, exclusive of the liquid vehicle, it being understood that the proportion of liquid vehicle may be readily varied to facilitate application. Commercial purity palladium powder and titanium dioxide powder were obtained. Particle sizes for the powders were between about 0.5 and 2.5 microns. The vehicle was prepared by dissolving about 5 weight percent ethyl cellulose, about 0.9 weight percent isopropyl palmitate added as a plasticizer, and about 0.4 weight percent of a dispersant in alpha terpineol. A suitable dispersant is a polypropoxylated quarternary ammonium chloride compound. Prior to formulation, the powders were blended to obtain a uniform mixture. About 55 parts by weight of the powder mixture was blended with about 45 parts by weight of the vehicle to produce the paste.

A sinterable base was prepared by a tape casting process using a slurry composed of 99 parts by weight of the described SCT powder and about 1 part powdered calcium titanium silicate, $CaTiSiO_5$, dispersed in a vaporizable liquid solvent vehicle containing an expendable organic binder. The slurry was cast and dried to produce a self-sustaining green tape which provided a suitable base. The paste was applied by screen printing onto a surface of the base and dried to produce a predominantly palladium particulate layer. The coated base was heated in air to a temperature between about 1,2850° C. and 1,3200° C., and preferably between 1,2900° C. and 1,3100° C. During the early stages of heating, the organic binder and any remaining organic residue derived from the vehicle was vaporized. At the firing temperature, the ceramic powders sintered to produce an integrally bonded substrate. Concurrently, the palladium layer sintered to form a palladium film that was tightly bonded to the substrate. Because palladium oxide decomposes at the sintering temperature, sintering may be suitably carried out in air. However, the palladium surface tends to oxidize as the film is cooled below about 9000° C., which oxide adversely affects wettability during subsequent soldering operations. Accordingly, during the cool down following sintering, the palladium film was annealed in nitrogen atmosphere at 850° C. for about ten minutes to reduce the palladium oxide and thereby improve solderability.

The resulting co-fired product thus features a film that is formed substantially of sintered palladium and is tightly bonded to the SCT substrate. It is found that the film formed using the combination of the titanium dioxide and SCT additives exhibits substantially increased adhesion to the titanate substrate. A series of palladium films were prepared on SCT substrates by the described process that included titanium dioxide and SCT additions to the paste. Adhesion of the film was measured by a standard 90° peel test. The films I 0 exhibited an average adhesion strength of 1.93 kilograms. For purposes of comparison, a palladium film was similarly co-fired onto a SCT substrate, but utilizing a paste containing the palladium powder but without the addition of titanium dioxide or SCT powder. The adhesion value was determined to be 0.53 kilograms, substantially less than the film formed with the paste containing the additives in accordance with this invention.

The dramatic improvement in adhesion is attributed to the combination of titanium dioxide powder and SCT powder. A co-fired palladium film was similarly formed on a SCT substrate utilizing a paste comprising palladium powder and about 5 weight percent SCT powder, but without the titanium dioxide powder. The adhesion measured by the peel test was determined to be 0.7 kilograms. Similarly, a co-fired palladium film was formed onto a SCT substrate utilizing a paste comprising palladium powder and about 3 weight percent titanium dioxide powder, but without the SCT powder, and found to have an adhesion strength of 0.49 kilograms. Thus, neither additive individually was capable of producing the remarkable improvement in adhesion strength that is obtained by their combination.

Therefore, this invention provides a paste in which the powder phase is composed substantially of sinterable palladium powder and thus forms a metallic film having high electrical conductivity and other properties desired for electrical features of a product. While metallic palladium was used in the preferred embodiment, the powder may optionally contain small amounts of alloys to modify the characteristics of the metal film, provided such additions do not compromise the sinterability of the powder.

It is a significant advantage of this invention that only minor additions of the non-metallic additives are effective to dramatically improve film adhesion without adversely affecting the overall metallic properties desired in the film. For the first additive, titanium dioxide powder is readily commercially available. Titanium dioxide additions as small as 0.5 weight percent have been found to significantly improve adhesion in combination with the titanate compound, while additions greater than about 4 weight percent tend to produce cracking and warping in the film. The preferred range for the titanium dioxide powder is between about 1.5 and 3.0 weight percent. While in the described embodiment, the second additive was formed of a preferred SCT material, it is believed that the titanate powder may be composed of any suitable metal titanate compound including barium titanate and magnesium calcium titanate, in addition to SCT, in which the metal species, exclusive of titanium, is substantially one or more metals selected from the group of alkaline earth metals, i.e., magnesium, calcium, strontium and barium. For the preferred SCT powder, additions of as little as about 2.5 weight percent, in combination with the titanium dioxide addition, significantly improve film adhesion, while additions greater than about 6 weight percent tend to produce cracking and warpage of the film and are not desired. A preferred range is between about 4 and 5.7 weight percent. In the described embodiment, the preferred SCT powder included a manganese addition to enhance properties of the substrate. However, manganese is not believed to significantly contribute to the improved film adhesion. As used herein, strontium calcium titanate refers to a titanate compound in which the metal (exclusive of titanium) is predominantly strontium and calcium, preferably within the ranges of the described embodiment, and optionally including manganese or other minor additives.

In formulating the paste, the powders are dispersed in an organic liquid vehicle that is vaporized during drying. It is a significant advantage of this invention that the liquid to solid proportions may be varied to facilitate a selected application technique, since the dried layer is formed almost entirely of the powders. In general, a suitable paste is formed comprising between about 30 and 70 percent powder. The vehicle preferably an organic base liquid that vaporizes without residue and may contain organic additives, for example, a a binder or dispersant, that vaporize or decompose during the early stages of heating.

In the described embodiment, a metal titanate powder was selected having the same composition as the base for the substrate. However, the palladium paste of this invention may be utilized to form a film onto a substrate of any suitable ceramic material. The combination of additives believed to be particularly well suited for forming a film on an alkaline earth titanate substrate. It is preferred to minimize bismuth in the substrate to avoid formation of unwanted intermetallic compounds with the palladium. The substrate may be suitably preformed prior to application of the paste. It is a particular advantage of this invention that the paste may be utilized to form a co-fired film at relatively high sintering temperatures. In general, the applied metal particulate layer may be suitably sintered between about 1,000° C. and 1,400° C. This includes a range between about 1,285° C. and about 1,3200° C., preferred in sintering SCT and the like.

While this invention has been described in certain embodiments thereof, it is not intended that it be limited to the above description, but rather only to the extent set forth in the claims that follow.

The embodiments of the invention in which an exclusive property or privilege is claimed are defined as follows:

1. A palladium paste for forming a sintered metallic palladium film, said paste comprising a vaporizable liquid vehicle and a sinterable palladium powder dispersed in the vehicle, said paste further comprising a titanium dioxide powder and a powder composed of a strontium calcium titanate compound dispersed in the vehicle to enhance adhesion of the film.

2. A palladium paste for forming a sintered metallic palladium film onto a ceramic substrate, said paste comprising a vaporizable liquid vehicle and a sinterable palladium powder dispersed in the vehicle, said paste further comprising between about 0.5 and 4.0 weight percent a titanium dioxide powder and between about 2.5 and 6.0 weight percent a strontium calcium titanate powder, wherein the amounts are based upon the combined weight of the powders, said powders being dispersed in the vehicle to enhance adhesion of the film to the substrate.

3. A palladium paste in accordance with claim 2 wherein the titanium dioxide powder is between 1.5 and 3.0 weight percent.

4. A paste in accordance with claim 2 wherein the strontium calcium titanate powder is between 4.0 and 5.7 weight percent.

5. A palladium paste in accordance with claim 2 wherein the strontium calcium titanate powder is formed of a compound having the formula $(Sr_yCa_yMn_z)TiO_3$ wherein $x+y+z$ is optionally between about 0.98 and 1.02, y is between about 0.34 and 0.4 and z is between about 0.0075 and 0.015.

6. A palladium paste in accordance with claim 2 wherein the total powders constitute between about 30 and 70 weight percent of paste.

7. In a process for forming a sintered metallic palladium film onto a ceramic substrate, said process comprising applying a paste composed of a palladium powder dispersed in a vaporizable liquid vehicle and heating at a temperature and for a time effective to sinter the palladium powder to form an integral film, the improvement comprising applying a paste that includes, in addition to the palladium powder, a titanium dioxide powder and a powder formed of a strontium calcium titanate compound to enhance adhesion of the film to the substrate.

8. In a process forming a sintered metallic palladium film onto a ceramic substrate, said process comprising applying a paste composed of a palladium powder dispersed in a vaporizable vehicle and heating to sinter the palladium powder to form an integral film, the improvement comprising applying a paste that includes, in addition to the palladium powder, between about 0.5 and 4.0 weight percent a titanium dioxide powder and between about 2.5 and 6.0 weight percent a strontium calcium titanate powder, wherein the amounts are based upon the combined weight of powders in the paste, said powders being dispersed in the vehicle to enhance adhesion of the film to the substrate.

9. A process in accordance with claim 8 wherein the titanium dioxide powder is between 1.5 and 3.0 weight percent.

10. A process in accordance with claim 8 wherein the strontium calcium titanate powder is between 4.0 and 5.7 weight percent.

11. A process in accordance with claim 8 wherein the strontium calcium titanate powder is formed of a compound having the formula $(Sr_yCa_yMn_z)TiO_3$ wherein $x+y+z$ is between about 0.98 and 1.02, y is between about 0.34 and 0.4 and optionally z is between about 0.0075 and 0.015.

12. A process in accordance with claim 11 wherein the substrate is predominantly formed of a compound compositionally similar to the strontium calcium titanate powder.

13. In a co-sintering process for forming palladium-coated ceramic article, said process comprising forming a base composed of a ceramic powder, applying a paste onto a surface of said base to form a coated base, said paste being composed of a palladium powder dispersed in a vaporizable liquid vehicle, and heating the coated base at a temperature and for a time effective to sinter the base to form an integral substrate and to concurrently sinter the palladium powder to form an integral film bonded to the substrate, the improvement comprising applying a paste that includes, in addition to the palladium powder, a titanium dioxide powder and a strontium calcium titanate powder to enhance adhesion of the film to the substrate.

14. In a co-sintering process forming a palladium-coated ceramic article, said process comprising forming a base composed of a strontium calcium titanate powder, applying a paste to a surface of the base to form a coated base, said paste being composed of a palladium powder dispersed in a vaporizable vehicle, and heating the coated base at a temperature and for a time effective to sinter the base to form a substrate and to concurrently sinter the palladium powder to form an integral film bonded to the substrate, the improvement comprising applying a paste that includes, in addition to the palladium powder, between about 0.5 and 4.0 weight percent a titanium dioxide powder and between about 2.5 and 6.0 weight percent a strontium calcium titanate powder, wherein the amounts are based upon the combined weight of powders in the paste, said powders being dispersed in the vehicle to enhance adhesion of the film to the substrate.

15. A process in accordance with claim 14 wherein the titanium dioxide powder is between 1.5 and 3.0 weight percent.

16. A process in accordance with claim 14 wherein the strontium calcium titanate powder is between 4.0 and 5.7 weight percent.

17. A process in accordance with claim 14 wherein the strontium calcium titanate powder is formed of a compound having the formula $(Sr_yCa_yMn_z)TiO_3$ wherein $x+y+z$ is between about 0.98 and 1.02, y is between about 0.34 and 0.4 and z is between about 0.0075 and 0.015.

18. A process in accordance with claim 14 wherein the temperature for sintering is between about 1000° C. and 1400° C.

19. A process in accordance with claim It wherein the temperature for sintering is between about 1285° C. and 1320° C.

20. A process in accordance with claim 14 wherein the base comprises an expendable organic binder.

21. A process in accordance with claim 17 wherein the base is predominantly formed of the compound similar to the strontium calcium titanate powder.

* * * * *